United States Patent
Wang et al.

(10) Patent No.: US 8,638,622 B2
(45) Date of Patent: Jan. 28, 2014

(54) APPARATUS AND METHOD FOR RECEIVING A DIFFERENTIAL DATA STROBE SIGNAL

(75) Inventors: Bingda B Wang, Milpitas, CA (US); Kostadin Gitchev, San Jose, CA (US)

(73) Assignee: ARM Limited, Cambridge (GB)

( * ) Notice: Subject to any disclaimer, the term of this patent is extended or adjusted under 35 U.S.C. 154(b) by 386 days.

(21) Appl. No.: 13/067,911

(22) Filed: Jul. 6, 2011

(65) Prior Publication Data

US 2013/0010546 A1 Jan. 10, 2013

(51) Int. Cl.
*G11C 7/00* (2006.01)

(52) U.S. Cl.
USPC ........................................ 365/193; 365/194

(58) Field of Classification Search
USPC ......... 365/193, 194, 198, 207, 233.1, 233.12, 365/233.5; 713/500–503, 600–601
See application file for complete search history.

(56) References Cited

U.S. PATENT DOCUMENTS

| | | | |
|---|---|---|---|
| 6,317,369 B1 * | 11/2001 | Kubo et al. .................... | 365/193 |
| 6,512,704 B1 * | 1/2003 | Wu et al. ................... | 365/189.07 |
| 6,940,760 B2 * | 9/2005 | Borkenhagen et al. .. | 365/189.05 |
| 7,068,727 B1 * | 6/2006 | Lo et al. .......................... | 375/295 |
| 7,652,937 B2 * | 1/2010 | Searles et al. ................. | 365/193 |
| 8,432,185 B2 * | 4/2013 | Scott et al. ...................... | 326/30 |
| 2007/0002642 A1 * | 1/2007 | Butt et al. ...................... | 365/193 |
| 2011/0019489 A1 * | 1/2011 | Huang et al. ................... | 365/193 |

* cited by examiner

*Primary Examiner* — Douglas King
(74) *Attorney, Agent, or Firm* — Nixon & Vanderhye P.C.

(57) ABSTRACT

A differential data strobe receiver is provided which is configured to receive a differential data strobe signal at a first strobe input and a second strobe input, wherein transitions of the differential data strobe signal indicate sample points for an associated data signal. The differential data receiver is configured to identify the transitions of the differential strobe signal by differentially comparing values of the differential strobe signal received at the first strobe input and the second strobe input. The differential data strobe receiver comprises strobe gating circuitry configured to generate a strobe gating signal, wherein the associated data signal can only be sampled in dependence on the differential data strobe signal when the strobe gating signal is asserted and strobe input termination circuitry configured selectively to provide a first termination connection for the first strobe input and a second termination connection for the second strobe input. The differential data strobe receiver is configured, prior to receiving the differential data strobe signal in association with the associated data signal, to participate in an initial gate training process to determine a gating delay used to phase align the strobe gating signal with respect to the differential data strobe signal and the strobe input termination circuitry is configured to provide an asymmetric configuration of the first termination connection and the second termination connection during the initial gate training process.

23 Claims, 10 Drawing Sheets

APPARATUS AND METHOD FOR RECEIVING A DIFFERENTIAL DATA STROBE SIGNAL

BACKGROUND OF THE INVENTION

1. Field of the Invention

The present invention relates to a data processing apparatus for receiving data signals. More particularly, this invention relates to a differential data strobe receiver configured to receive a differential data strobe signal, wherein transitions of the differential data strobe signal indicate sample points for an associated data signal.

2. Description of the Prior Art

It is known to transmit a data signal via a transmission path with an associated data strobe signal which provides a clock signal indicating the intervals at which the data signal should be sampled at a receiver side of the transmission path in order to correctly interpret the data being transmitted from a transmitter side of the transmission path. One known way of providing such a clock signal is in the form of a differential data strobe signal on two parallel paths, wherein the transitions of the signal, which indicate the sampling points for the associated data signal, are identified by a differential comparison of the individual signals on each path with one another to generate a clock signal for sampling the data signal. Such differential signalling has known advantages, such as its improved resilience to environmental noise.

Accordingly, it is known to provide a differential data strobe receiver configured to receive a differential data strobe signal at a first strobe input and a second strobe input, wherein transitions of the differential data strobe signal indicate sample points for an associated data signal. The first and second strobe inputs are typically arranged to be selectively terminated by the receiver, to allow a differential data strobe signal to be correctly received and interpreted when required (by terminating the two inputs), but also to allow the inputs to be disconnected from the termination when data is not being received to avoid unnecessary power consumption. The transmission path can be bidirectional, allowing data to be transmitted in either direction, depending on the configuration and hence setting up the transmission path for data transmission in a given direction will then comprise switching the termination from a differential data strobe receiver at one end of the path to a differential data strobe receiver at the other end. Transmitted data is typically transmitted in short bursts interspersed by inactive periods, so it is usual to disconnect the termination during the inactive periods and only terminate the inputs when a burst of data is expected.

It is therefore necessary, in order to correctly receive a transmitted differential data strobe signal, to terminate the first and second strobe inputs in advance of the arrival of the transitions of the differential data strobe signal that should be identified. However, once the first and second strobe inputs are terminated, the differential data strobe receiver becomes sensitive to noise on the transmission path, which might otherwise cause spurious data to be interpreted by the receiver, and accordingly it is known to gate the clock signal derived from the differential data strobe signal, such that sampling of the data signal only occurs when the gating allows the derived clock signal to be active.

Determining when to gate the derived clock signal is however a non-trivial task, since the assertion of the gating signal (to allow the clock signal to be derived from the received differential data strobe signal) must be precisely phase aligned with the start of a transmitted burst of data. For this reason it is known to prelude real data transmissions with at least one gate training transmission, which allows an initialization procedure to be carried out to set up this phase alignment. Typically a gate training transmission will comprise a preamble, when the two components of the differential data strobe signal on the two parallel paths are held at known, constant values (e.g. VDD and VSS respectively in an integrated circuit context), followed by a sequence of (dummy) differential transitions.

The phase alignment of the gating signal with the differential data strobe signal by means of a series of gate training transmissions in an initialization procedure requires an initial value of a delay applied to the gating signal to be selected, which is then fine tuned to phase align the two signals. However for this procedure to work the initial value of this delay must already be selected to be within a time window defined by the preamble of a gate training transmission and its first valid transition. On the one hand, if the delay allows the gating signal to be asserted too early, the receiver will be vulnerable to noise and a false relationship may be established between the gating signal and the differential data strobe signal. On the other hand, if the delay causes the gating signal is asserted too late, the receiver will miss genuine transitions of the training transmission and the phase alignment will be established with respect to a later transition, rather than the first transition as is required. In either case incorrect data will be interpreted based on the established timing relationship.

Furthermore, as transmission frequencies of the data strobe signals received by such differential data strobe receivers get ever higher, in order to allow higher data transmission rates, the time window in which the initial value of the gating delay must be placed is getting ever narrower, to the extent that known techniques for performing the initialization procedure may not be adequate in the light of parameter variations such as source clock jitter, PVT point variation, varying PCB skews, signal integrity variation (e.g. signal reflections) and so on.

Accordingly, it would be desirable to provide an improved technique for performing the initialization of a differential data strobe receiver, which is better able to cope with the trend towards higher transmission frequencies.

SUMMARY OF THE INVENTION

Viewed from a first aspect, the present invention provides a differential data strobe receiver configured to receive a differential data strobe signal at a first strobe input and a second strobe input, wherein transitions of said differential data strobe signal indicate sample points for an associated data signal, the differential data receiver configured to identify said transitions of said differential strobe signal by differentially comparing values of said differential strobe signal received at said first strobe input and said second strobe input, the differential data strobe receiver comprising:

strobe gating circuitry configured to generate a strobe gating signal, wherein said associated data signal can only be sampled in dependence on said differential data strobe signal when said strobe gating signal is asserted; and strobe input termination circuitry configured selectively to provide a first termination connection for said first strobe input and a second termination connection for said second strobe input, wherein said differential data strobe receiver is configured, prior to receiving said differential data strobe signal in association with said associated data signal, to participate in an initial gate training process to determine a gating delay used to phase align said strobe gating signal with respect to said differential data strobe signal, wherein said strobe input termination circuitry is configured to provide an asymmetric configuration of said first termination connection and said second termination connection during said initial gate training process.

The strobe input termination circuitry, according to the present technique, is configured to provide an asymmetric configuration of the first termination connection and the second termination connection during the initial gate training process. In other words, both the first strobe input and the second strobe input are terminated (in order to allow the differential data strobe signal to be received) but the respective terminations provided for each differ from one another. The inventors of the present invention realised that arranging the strobe input termination circuitry in this manner could be of particular advantage during an initial gate training process used to determine a gating delay for phase aligning the strobe gating signal with the differential data strobe signal.

This is due to the fact that an asymmetric configuration of the two termination connections holds the first strobe input and second strobe input in a well defined and clearly distinguished state which is less vulnerable to noise in the way that a symmetric configuration of the termination connections would be, thus enabling the initial phase alignment in the initial gate training process to be carried out with less risk of misalignment due to noise.

A further advantage of the asymmetric configuration of the first and second termination connections during the initial gate training process is that this enables the time window, in which the initial value of the gating delay must be placed in order for the phase alignment of the strobe gating signal and the differential data strobe signal to be carried out, to be extended to cover the entire time period between transitions of the differential data strobe signal during the initial gate training process. Given the above-mentioned tendency for this time window in which the initial value of the gating delay must be placed to get ever narrower as clock speeds increase, the present technique is therefore of particular advantage in the context of the trend towards higher transmission frequencies, since the need to select an initial value of the gating delay in order to initiate the initial gate training process becomes much easier.

In some embodiments, the differential data strobe receiver comprises a first voltage source and a second voltage source, wherein said first voltage source and said second voltage source define a maximum voltage range of said differential data strobe signal.

The asymmetric configuration may be provided in a number of ways, but in one embodiment the strobe input termination circuitry is configured to provide said asymmetric configuration by exclusively coupling said first strobe input to said first voltage source and by exclusively coupling said second strobe input to said second voltage source. Accordingly, where a conventional symmetric configuration of the first termination connection and second termination connection would typically be provided by connecting the first and second strobe inputs to both the first voltage source and the second voltage source (e.g. via resistors of equal value to each) in this embodiment the strobe input termination circuitry is configured to terminate the first strobe input and the second strobe input during the initial gate training process by connecting one to the first voltage source alone and the other to the second voltage source alone. Given that the first voltage source and the second voltage source define the maximum voltage range of the differential data strobe signal, this arrangement therefore provides a strongly asymmetric configuration for the termination of the first and second strobe inputs.

In one embodiment said strobe input termination circuitry is configured to provide said asymmetric configuration by coupling said first strobe input and said second strobe input to said first voltage source via first resistors of differing resistance and by coupling said first strobe input and said second strobe input to said second voltage source via second resistors of differing resistance. Accordingly, in this embodiment instead of only connecting each strobe input to one of the voltage sources, the strobe input termination circuitry is instead configured to couple the first and second strobe inputs to each voltage source via resistors of differing resistance, such that the termination configuration of the two strobe inputs differs from one another.

In some embodiments said strobe input termination circuitry comprises plural first resistors via which said first strobe input is connectable to said first voltage source and plural second resistors via which said second strobe input is connectable to said second voltage source. Providing plural resistors via which each strobe input may be connected to each voltage source means that the strobe input determination circuitry can provide a number of distinct asymmetric configurations for the first termination connection and the second termination connection. Accordingly, the strobe input termination circuitry can adapt to different operating conditions (for example when the background noise level changes) or can provide different configurations for use in different gate training processes.

The plural first resistors may be used in various ways, but in one embodiment said strobe input termination circuitry is configured to select a connection between said first strobe input and said first voltage source from said plural first resistors. Accordingly different termination connections for the first strobe input can be selected by connecting the first strobe input to the first voltage source via a selected first resistor.

In some embodiments said strobe input termination circuitry comprises more than one first resistor via which said first strobe input is connectable to said second voltage source and more than one second resistor via which said second strobe input is connectable to said first voltage source. Hence, the first strobe input may also have a number of resistors via which it is connected to the second voltage source and the second strobe input may have a number of resistors by which it is connected to the first voltage source. This provides the strobe input termination circuitry with further configurational possibilities for providing the asymmetric termination connections.

The plural second resistors may be used in various ways but in one embodiment said strobe input termination circuitry is configured to select a connection between said second strobe input and said second voltage source from said plural second resistors. As mentioned above with respect to the plural first resistors, this provides the strobe input termination circuitry with a mechanism for selecting different termination connections for the second strobe input.

In some embodiments said strobe input termination circuitry is responsive to plural termination enable signals to selectively couple said first strobe input and said second strobe input to said first voltage source and said second voltage source. Accordingly, the differential data strobe receiver can configure its strobe input termination circuitry in response to the assertion of a selected termination enable signal according to the required status of the strobe input termination circuitry, for example to configure it for an initial gate training process, for a subsequent gate training process or to configure it for normal data reception.

In some embodiments said differential data strobe receiver is configured, prior to receiving said differential data strobe signal in association with said associated data signal and after said initial gate training process, to participate in a further gate training process to determine an adjusted version of said gating delay for use when receiving said differential data strobe signal in association with said associated data signal, wherein said strobe input termination circuitry is configured to provide a symmetric configuration of said first termination connection and said second termination connection during said further gate training process. Hence a first determination of the gating delay is performed with an asymmetric configuration of the first termination connection and the second termination connection (because of the above described benefits in terms of establishing the phase alignment of the strobe gating signal with respect to the differential data strobe signal when using an asymmetric termination of the strobe inputs), but in order to fine-tune the gating delay for use when receiving "real data" an adjusted version of the gated delay is determined in a further gate training process in which a symmetric configuration of the first and second termination connections is provided. This enables the gating delay established in the initial gate training process to be fine-tuned to be appropriate for the symmetric configuration of the termination connections which will be used during normal data reception.

Whilst the strobe input termination circuitry could be configured to provide various different symmetric configurations of the first and second termination connections, in some embodiments in order to prepare the differential data strobe receiver for data reception, said strobe input termination circuitry is configured to provide said symmetric configuration corresponding to a data transfer configuration of said first termination connection and said second termination connection used for receiving said differential data strobe signal in association with said associated data signal.

In some embodiments said differential data strobe receiver is configured to use said gating delay as a starting value for said adjusted version of said gating delay when beginning said further gate training process. Accordingly, having benefited from the enhanced timing window in which the gating delay could be determined using the asymmetric termination configuration of the initial gate training process, the differential data strobe receiver can make use of the gating delay established during that initial gate training process as a starting value for determining the adjusted version of the gating delay in the further gate training process, during which the timing window will be considerably shorter due to the symmetric configuration of the termination connections used.

In some embodiments said differential data strobe receiver is configured to participate in a multi-stage initial gate training process, wherein said strobe input termination circuitry is configured to provide a different asymmetric configuration of said first termination connection and said second termination connection for each stage of said multi-stage initial gate training process. This enables the differential data strobe receiver to adapt the gating delay in stages, from a first asymmetric configuration (which may be well suited to establishing a first value of the gating delay, but may be rather different from the final data-receiving symmetric configuration), through at least one intermediate configuration (which itself would be less well suited to establishing a first value of the gating delay, but may be more suitable as a stepping stone to the final data-receiving symmetric configuration).

The phase alignment could be determined in a number of ways, but in one embodiment this differential data strobe receiver further comprises phase detection circuitry configured to determine a phase alignment of said strobe gating signal with respect to said differential data strobe signal in dependence on said gating delay. A phase detection circuit typically offers a low power, low frequency (unlike oversampling techniques) manner of establishing the phase alignment which is well configured to dynamically tracking timing shifts of the received differential data strobe signal.

In some embodiments the differential data strobe receiver is configured to cause a gate training transaction request to be intermittently sent to a source of said differential data strobe signal and said associated data signal until said phase detection circuitry indicates said phase alignment has been achieved, wherein said gate training transaction request causes a predetermined training pattern to be applied to said differential data strobe signal. Accordingly, the differential data strobe receiver can cause predetermined training patterns to be transmitted, such that it can perform its gate training until phase alignment has been achieved.

In some embodiments said phase detection circuitry is configured to determine said phase alignment of said strobe gating signal with respect to a first valid transition of said predetermined training pattern. The first valid transition of the predetermined training pattern (which follows the preamble of the predetermined training pattern) enables the data strobe receiver to configure itself such that when real data is received, the first valid transition after the preamble of the valid data will equivalently be recognised, ensuring that all valid data transmitted is also received.

In some embodiments, the differential data strobe receiver is configured to apply a signal delay to said differential data strobe signal after said strobe gating signal has been phase aligned with respect to said differential data strobe signal. Having phase aligned the strobe gating signal with respect to the differential data strobe signal, the differential data strobe receiver may apply a delay to the differential data strobe signal, in order to ensure that when the associated data signal is sampled in dependence on the identified transitions of the differential strobe signal, the data signal is in a well defined state (i.e. high or low and not in an intermediate transition state).

Viewed from a second aspect the present invention provides memory access circuitry comprising the differential data strobe receiver according to the first aspect.

It should be appreciated that the differential data strobe receiver could be associated either with data transfers to a memory or data transfers from a memory. Accordingly in some embodiments said differential data strobe signal is a read data strobe signal, whilst in other embodiments said differential data strobe signal is a write data strobe signal.

In some embodiments the memory access circuitry is configured to access DRAM memory.

Viewed from the third aspect the present invention provides a differential data strobe receiver configured to receive a differential data strobe signal at a first strobe input and a second strobe input, wherein transitions of said differential data strobe signal indicate sample points for an associated data signal, the differential data receiver comprising differential comparison means for identifying said transitions of said differential strobe signal by differentially comparing values of said differential strobe signal received at said first strobe input and said second strobe input, the differential data strobe receiver comprising:

strobe gating means for generating a strobe gating signal, wherein said associated data signal can only be sampled in dependence on said differential data strobe signal when said strobe gating signal is asserted; and strobe input termination means for selectively providing a first termination connection for said first strobe input and a second termination connection for said second strobe input, wherein said differential data strobe receiver is configured, prior to receiving said differential data strobe signal in association with said associated data signal, to participate in an initial gate training process to determine a gating delay used to phase align said strobe gating signal with respect to said differential data strobe signal, wherein said strobe input termination means is configured to provide an asymmetric configuration of said first termination connection and said second termination connection during said initial gate training process.

Viewed from the fourth aspect the present invention provides a method of operating a differential data strobe receiver configured to receive a differential data strobe signal at a first strobe input and a second strobe input, wherein transitions of said differential data strobe signal indicate sample points for an associated data signal, the differential data receiver configured to identify said transitions of said differential strobe signal by differentially comparing values of said differential strobe signal received at said first strobe input and said second strobe input, the method comprising the steps of:

generating a strobe gating signal, wherein said associated data signal can only be sampled in dependence on said differential data strobe signal when said strobe gating signal is asserted;

selectively providing a first termination connection for said first strobe input and a second termination connection for said second strobe input;

prior to receiving said differential data strobe signal in association with said associated data signal, participating in an initial gate training process to determine a gating delay used to phase align said strobe gating signal with respect to said differential data strobe signal; and providing an asymmetric configuration of said first termination connection and said second termination connection during said initial gate training process.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
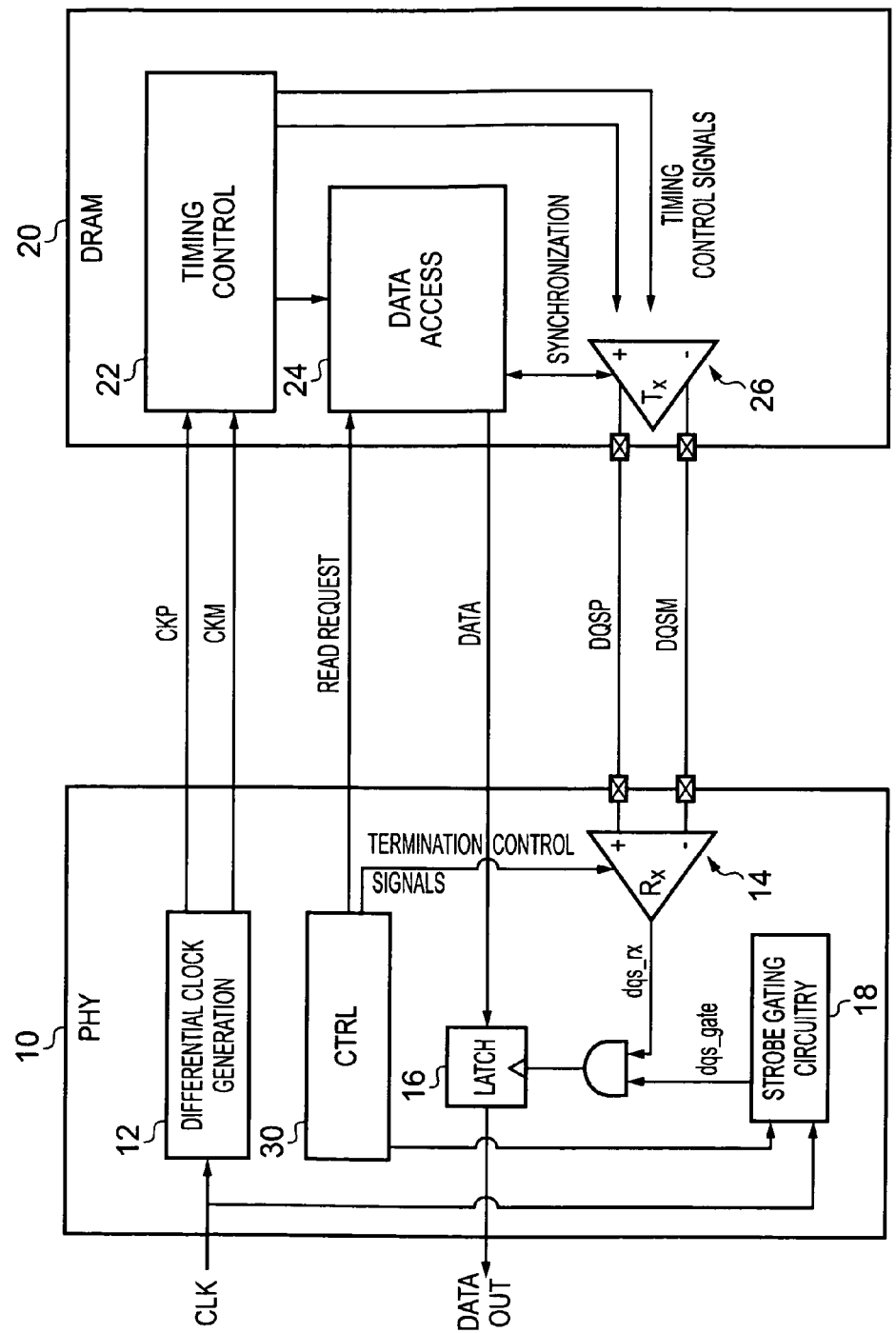
FIG. 1 schematically illustrates a system-level view of an arrangement for reading data from a DDR DRAM memory, which includes a differential data strobe receiver according to one embodiment.

FIG. 1 schematically illustrates some components of a high frequency DDR DRAM memory system in one embodiment. An interface 10 is provided for accessing data stored in a DRAM 20. The interface 10 ("PHY") comprises a differential clock generation unit 12 which receives a clock signal CLK and generates differential clock signals CKP and CKM which are transmitted to DRAM 20. These differential clock signals are made use of by the timing control 22 to control access to the data stored in the DRAM 20 (generically illustrated by the "data access" block 24) and for the differential data strobe transmitter 26. The timing control 22 coordinates the data access 24 and the data strobe transmitter 26 such that the differential data strobe signal generated by transmitter 26 (comprising DQSP and DQSM) can be used by the interface 10 to receive (i.e. to correctly interpret) the data transmitted from data access 24. In other words the data sent from data access unit 24 to interface 10 is synchronized with the differential data strobe signal (DQSP/DQSM).

The differential data strobe signal (DQSP/DQSM) is received in the interface 10 by differential data strobe receiver 14. Differential data strobe receiver 14 converts the DQSP/DQSM signals into the single signal dqs_rx which indicates the transition points of the differential data strobe signal and thus indicates the intervals at which the data received from DRAM 20 should be sampled. The data received from the DRAM 20 by interface 10 is received at latch 16. Latch 16 is clocked in dependence on the dqs_rx signal generated by data strobe receiver 14, but also in dependence on a gating signal dqs_gate generated by strobe gating circuitry 18.

Strobe gating circuitry 18 generates the dqs_gate signal in dependence on the clock signal CLK and under control of the interface control unit 30. Further detail of the generation of the dqs_gate signal will be discussed in more detail with reference to the following figures. Interface control unit 30 is also configured to issue read requests to DRAM 20 which causes data access unit 24 to return selected data. These read requests may comprise accessing real data in the DRAM 20 or may be gate training read requests, which cause DRAM 20 to return a predetermined training pattern (on both the data path and the differential data strobe paths DQSP/DQSM) to the interface 10. This predetermined training pattern is used in an initial gate training process by the interface 10 to ensure that the relative timing of the dqs_gate and dqs_rx signals are correctly phase-aligned before real data is transmitted from DRAM 20 to interface 10. Further detail of this process will be described with reference to the following figures.

Interface control unit 30 can also configure data strobe receiver 14 via termination control signals which select the particular termination arrangement of the data strobe receiver 14. Changing the termination configuration of data strobe receiver 14 in dependence on the type of data currently being received from DRAM 20 (i.e. a predetermined training pattern or real data) enables the interface 10 to cope with very high transmission rates from DRAM 20, which would be difficult to achieve using a conventional differential data strobe receiver. The reasons for this will be discussed in more details with reference to the following figures.

Figure 2:
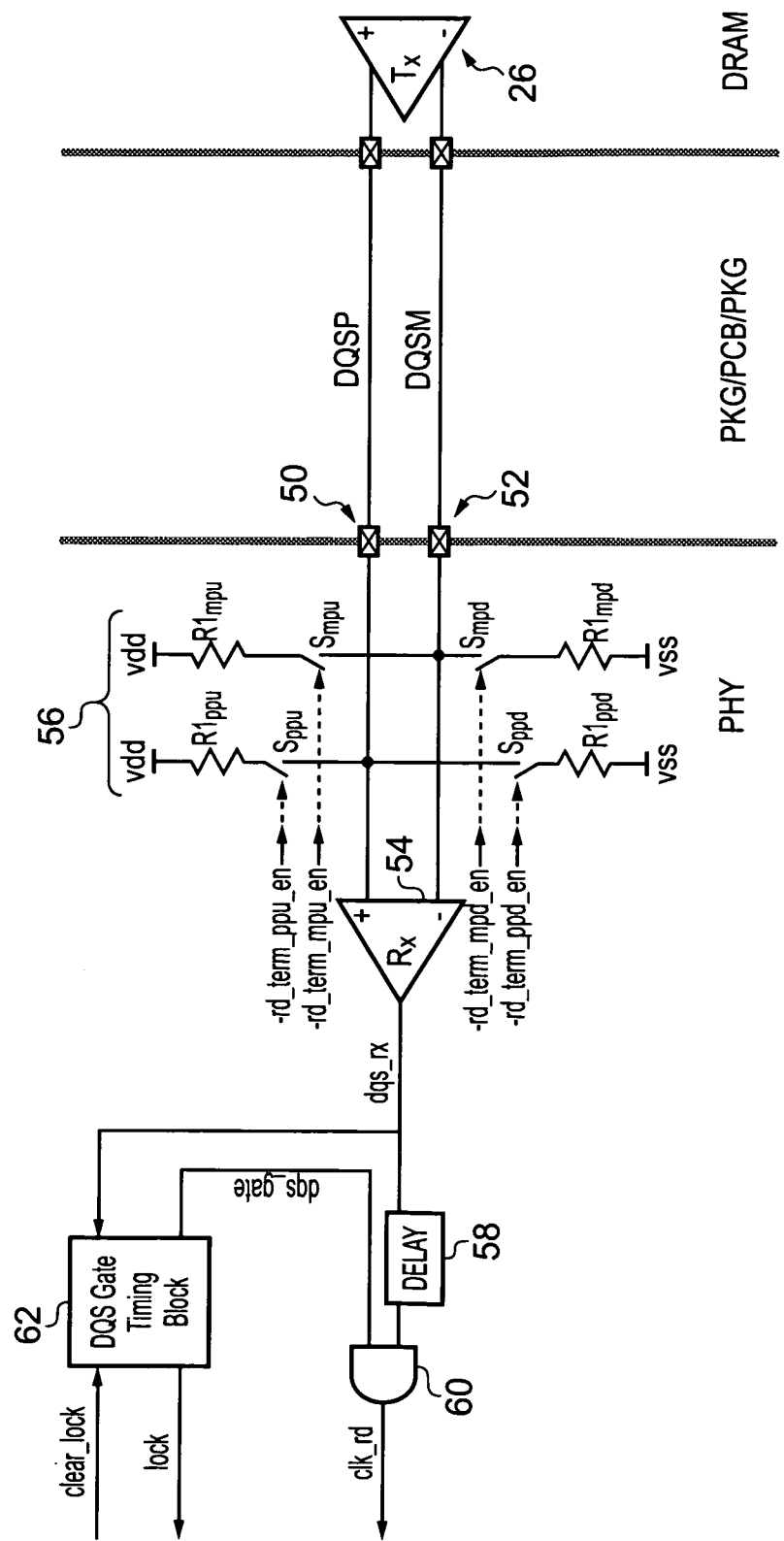
FIG. 2 schematically illustrates a differential data strobe receiver in one embodiment.

FIG. 2 schematically illustrates in more detail the components of the interface 10 in FIG. 1 particularly relating to the differential data strobe receiver. The differential data strobe signal (DQSP/DQSM) is transmitted by the transmitter 26 in the DRAM. The signals DQSP and DQSM are carried across the printed circuit board (PCB) and into the interface (PHY) via pins 50, 52. These connect to the respective positive and negative inputs of comparator 54 which acts as the receiver for the differential data strobe signal, comparing the two components of the differential data strobe signal received and generating the signal dqs_rx. Comparator 54 is configured such that dqs_rx transitions between a high state and a low state (or vice versa depending on the configuration) when the relative levels of DQSP and DQSM invert (i.e. the two states of dqs_rx indicate when DQSP>DQSM and when DQSP<DQSM respectively).

Strobe input termination circuitry 56 is provided such that the DQSP and DQSM transmission lines can be selectively terminated in order for comparator 54 to measure the relative levels of the two signals. Significantly, the strobe input termination circuitry comprises four individual switches $S_{ppu}$, $S_{mpu}$, $S_{ppd}$ and $S_{mpd}$ which are individually controlled by corresponding enable signals (rd_term_ppu_en; rd_term_mpu_en; rd_term_ppd_en; and rd_term_mpd en). Accordingly, the DQSP line can be selectively coupled to VDD via resistor $R1_{ppu}$ or to VSS via resistor $R1_{ppd}$ and the DQSM transmission line can be coupled to VDD via resistor $R1_{mpu}$ and to VSS via resistor $R1_{mpd}$. Hence, by the assertion of the appropriate rd_term signal the strobe input termination circuitry 56 can be configured in a number of different termination configurations. In particular, the strobe input termination circuitry 56 can be configured to provide symmetric termination for the DQSP and DQSM transmission lines, or can be configured to provide an asymmetric termination configuration for the DQSP and DQSM transmission lines, for example by coupling DQSP only to VDD and coupling DQSM only to VSS.

Once generated the dqs_rx signal passes via delay unit 58 to one input of AND gate 60. The other input of AND gate 60 is provided by the dqs_gate signal generated by DQS gate timing block 62. The output, of AND gate 60 provides the clk_rd signal which determines when an associated data signal transmitted in parallel to the differential data strobe signal should be sampled. DQS gate timing block 62 also receives the dqs_rx signal such that it can compare this to the dqs_gate signal it generates in order to phase align the two. When this phase alignment is achieved DQS gate timing block 62 can assert its lock signal indicating that this phase alignment has been achieved. Conversely the control unit of the interface containing the differential data strobe receiver can assert the clear_lock signal to reset DQS gate timing block when a new phase alignment procedure should be performed.

Figure 3:
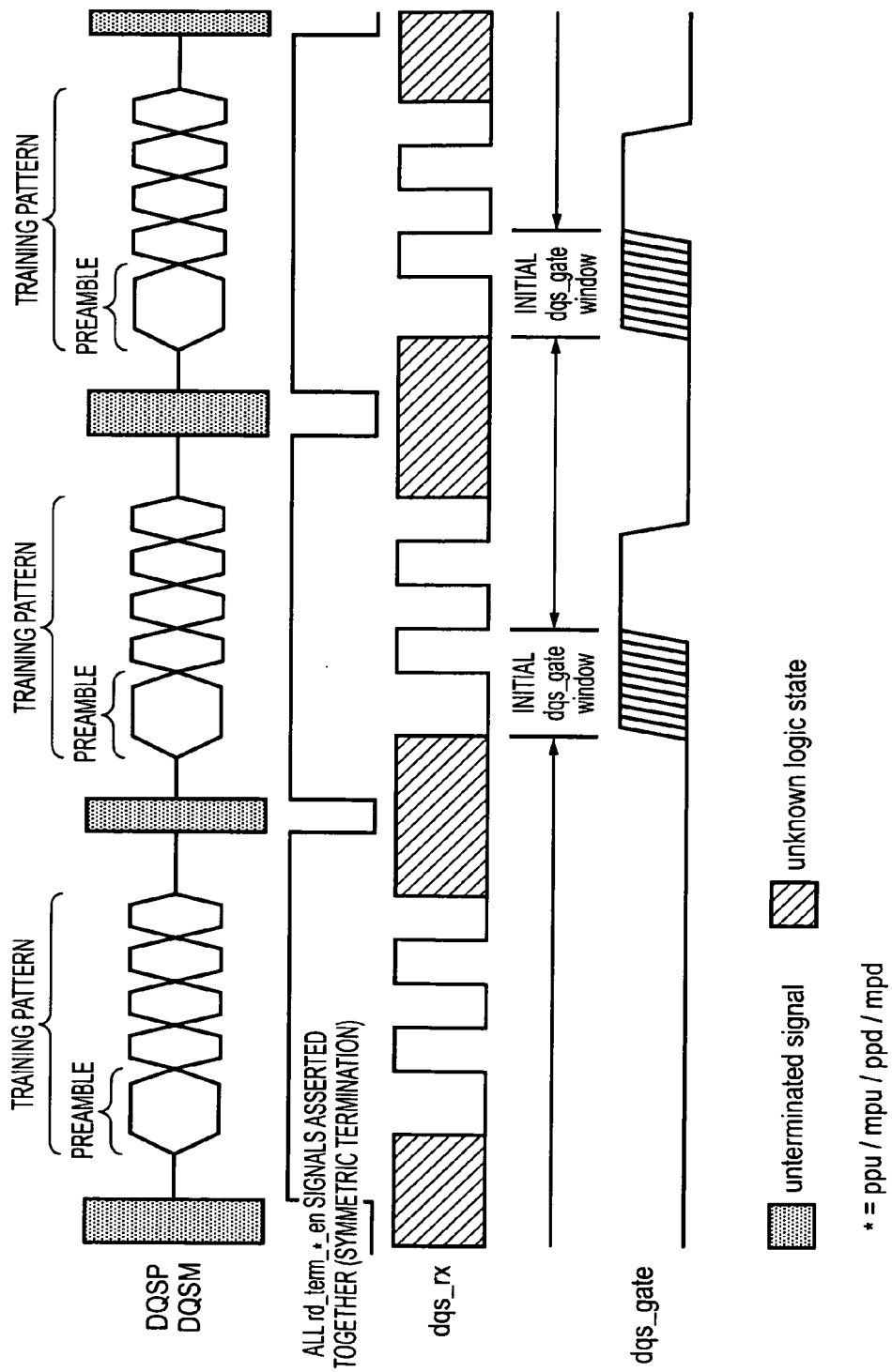
FIG. 3 schematically illustrates the timings of an initial gate training process if the differential data strobe receiver is configured with a symmetric termination configuration.

FIG. 3 illustrates the relative timing of the DQSP, DQSM, dqs_rx and dqs_gate signals. In the illustrated situation, the interface 10 has requested the transmission of a gate training transmission (a predetermined "training pattern") from the DRAM 20. Accordingly an initial gate training process should be carried out in which the dqs gate timing block seeks to phase align the dqs_gate signal it generates with the received dqs_rx signal. FIG. 3 illustrates a configuration in which the enable signals rd_term_*_en (where *=ppu; mpu; ppd; mpd) are asserted together, hence providing a symmetric termination of the DQSP and DQSM transmission lines. This is the configuration that should be adopted when real data is being transmitted.

However, FIG. 3 illustrates the difficulties that are presented to the differential data strobe receiver when seeking to initially determine a phase alignment between dqs_rx and dqs_gate, if the enable signals rd_term_*_en are asserted together to give a symmetric termination configuration (as would be the case for real data transmission). If the differential data strobe receiver is configured with this symmetric termination configuration for the DQSP and the DQSM transmission lines, it can be seen in the figure that there is only a relatively short time period in which the dqs_gate signal can have its first rising edge in order for the phase alignment with dqs_rx to be carried out. This is because after the strobe input termination circuitry has terminated the differential data strobe signal transmission lines symmetrically, dqs_rx remains in an unknown logic state until the preamble of the training pattern begins. Consequently, an initial value of the delay value which enables dqs_gate to be temporally shifted must be selected to place the rising edge of dqs_gate within a time window defined by the preamble of the training pattern up to the end of the first high pulse of dqs_rx. Any earlier and the unknown logic state of dqs_rx could cause a false timing relationship between dqs_gate and dqs_rx to be established due to noise on the DQSP/DQSM lines. Any later and the phase alignment will miss the first valid transition of dqs_rx, and thus the first valid data later transmitted would also be missed.

Figure 4:
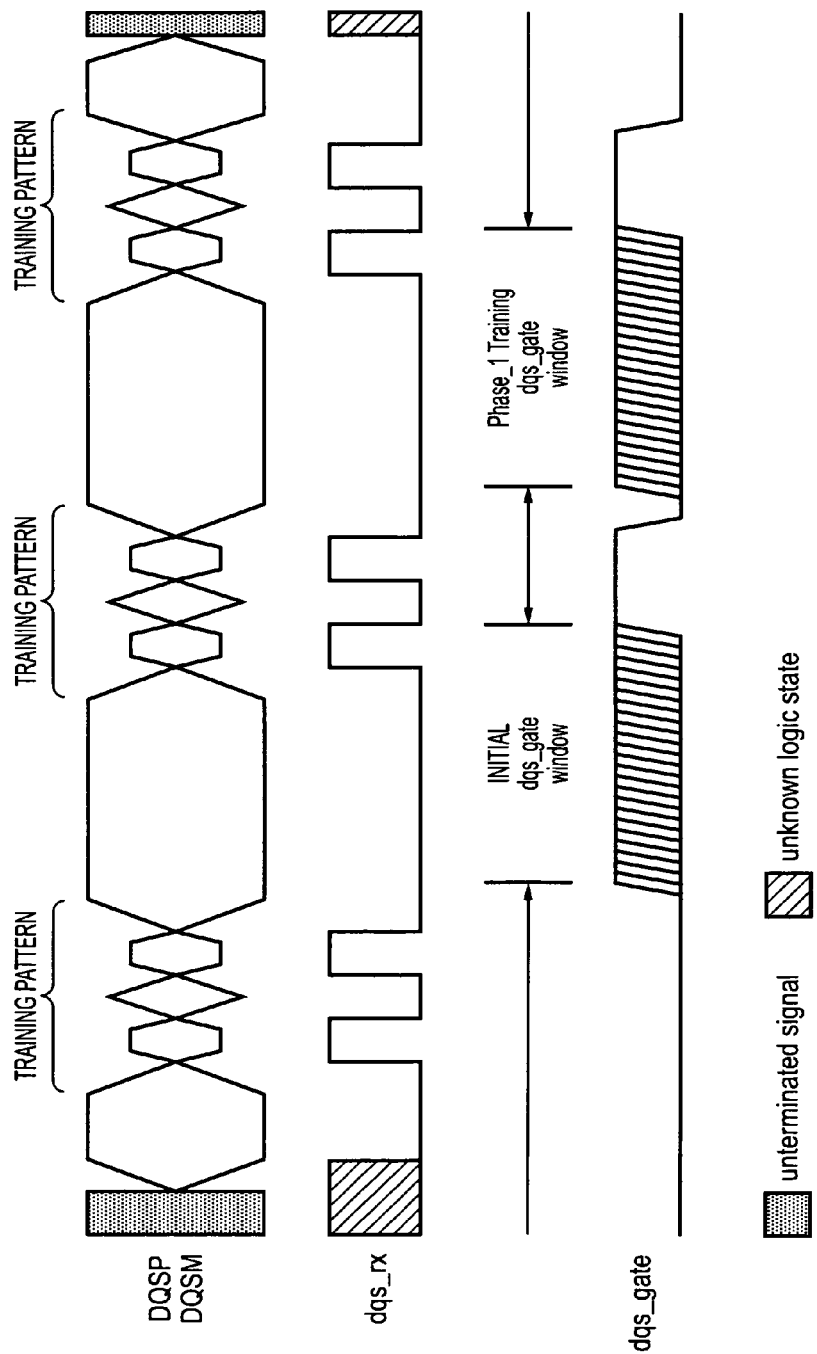
FIG. 4 schematically illustrates the timings of an initial gate training process in which the differential data strobe receiver has an asymmetric termination configuration.

Accordingly for an initial gate training process, the present invention proposes that an asymmetric termination configuration of the strobe input termination circuitry is used, as illustrated in FIG. 4. This asymmetric termination configuration (by appropriate selection of the enable signals rd_term_*_en, as will be further discussed below) means that in the intervals between the training patterns the DQSP and DQSM signals are pulled apart (towards VDD and VSS) and are thus held in well defined states. Noise on the transmission lines is very unlikely to cause DQSP and DQSM to invert with respect to another and cause a spurious pulse in the dqs_rx signal.

Crucially, the asymmetric configuration of the strobe input termination circuitry means that the initial dqs_gate window has become much wider, indeed it has been extended to cover the entire gap between gate training patterns. In other words, the rising edge of the dqs_gate signal can safely be placed much earlier without danger of a false timing relationship being established between dqs_gate and dqs_rx due to noise on the transmission lines causing a spurious edge in the dqs_rx signal. This is of particular benefit as transmission frequencies become ever faster, meaning that the initial dqs_gate window (with a symmetric termination configuration) correspondingly becomes ever narrower. The significantly wider initial dqs_gate window allowed by an asymmetric termination configuration greatly alleviates this problem.

Figure 5:
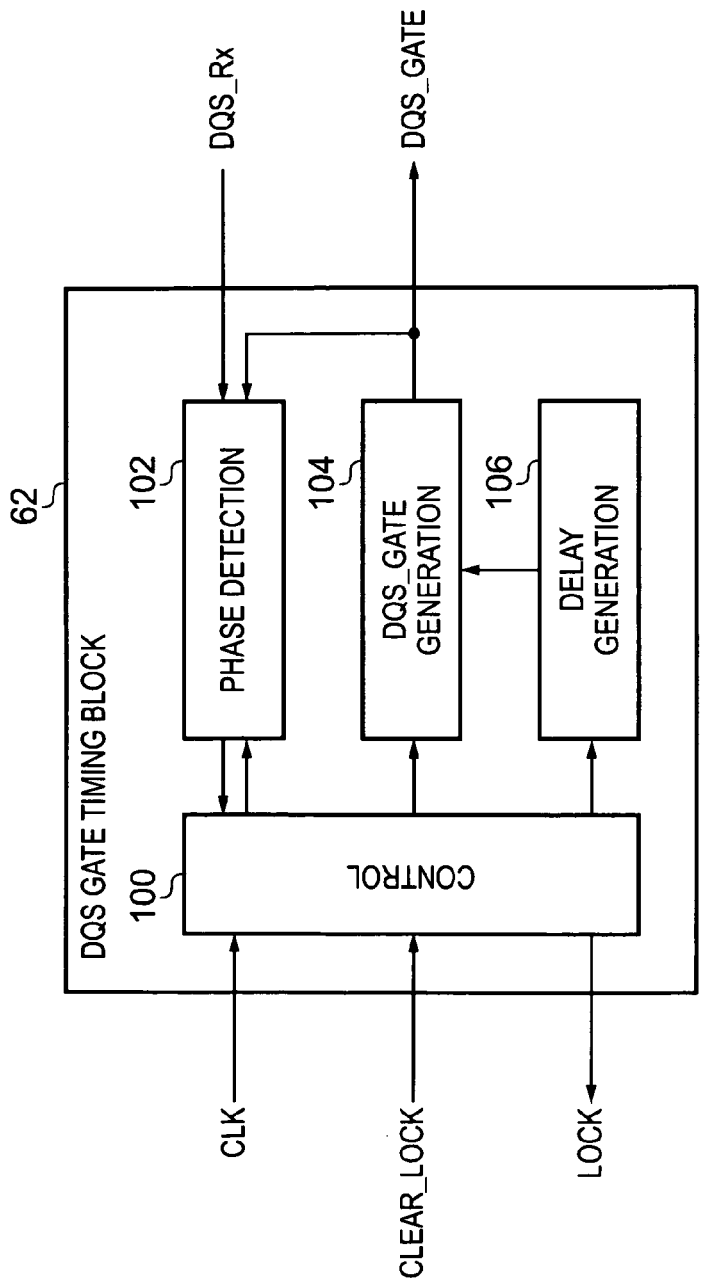
FIG. 5 schematically illustrates in more detail the configuration of the DQS gate timing block in FIG. 2.

FIG. 5 schematically illustrates in more detail the configuration of the DQS gate timing block 62 shown in FIG. 2. A control unit 100 receives an external clock signal CLK and a CLEAR_LOCK signal, which initiates a phase alignment process. The dqs_rx signal is received by phase detection unit 102, whilst the dqs_gate signal is generated by dqs_gate generation unit 104. Delay generation unit 106 is provided to allow the relative timing of the dqs_gate signal generated by dqs_gate generation unit 104 to be adjusted. In operation, after the CLEAR_LOCK signal has been asserted, the control unit 100 causes the dqs_gate generation unit 104 to generate a first iteration of the dqs_gate signal in dependence on the delay value provided by delay generation unit 106. The phase detection unit 102 compares the signals dqs_gate and dqs_rx, and determines whether the two are phase aligned. The result of this phase detection is signalled to control unit 100 such that until phase alignment is achieved, the delay generated by delay generation unit 106 can be iteratively adjusted. Once the phase alignment is established, the control unit 100 asserts the LOCK signal indicating that dqs_rx and dqs_gate are now aligned.

Figure 6:
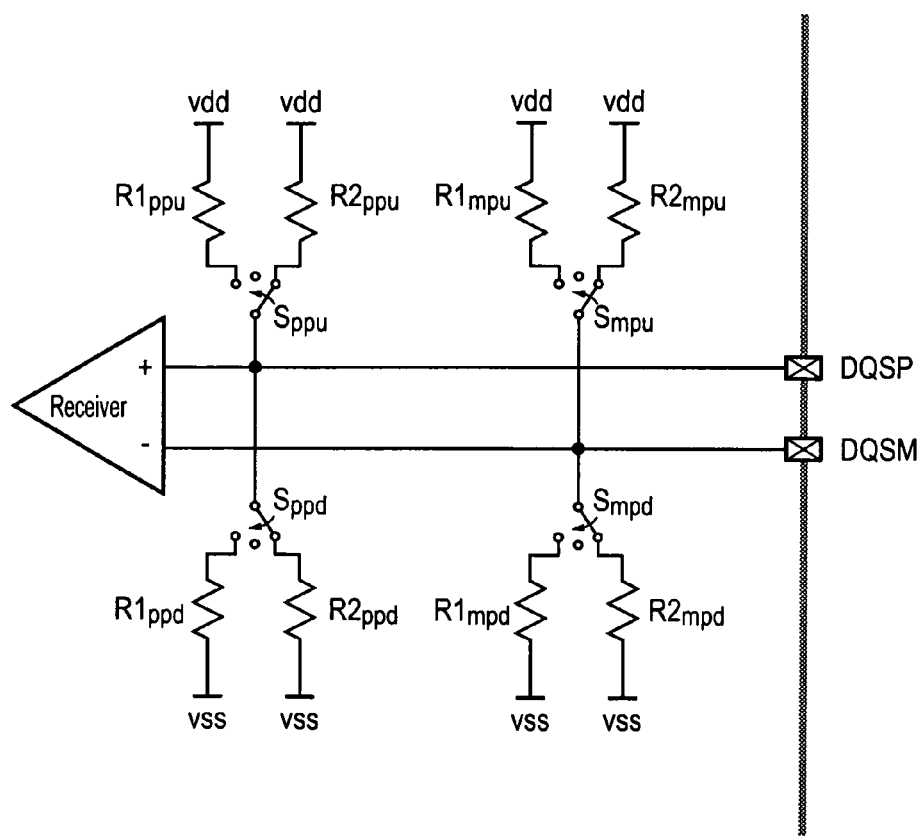
FIG. 6 schematically illustrates strobe input termination circuitry which can select between multiple termination configurations.

FIG. 6 schematically illustrates an alternative configuration of the differential data strobe receiver, in particular showing a different configuration of the strobe input termination circuitry. Here the switches $S_{ppu}$, $S_{mpu}$, $S_{ppd}$ and $S_{mpd}$ can each be controlled to select between more than one possible connection. For example this may be provided by each of the rd_term_*_en signals having three (or more) possible states. In the particular example illustrated in FIG. 6, each selection switch can couple its respective differential data strobe signal transmission line to one of two resistors connected to VDD or VSS, or it can disconnected, leaving the connection open. The ability of each switch to select between more than one resistive connection provides a number of termination configuration possibilities.

One particular possibility that this arrangement provides is that the differential data strobe receiver can be configured to participate in a multi-stage gate training process, for example where a strongly asymmetric termination configuration is first used (e.g. because of the benefits this brings in terms of opening up the dqs_gate window), followed by one or more less asymmetric termination configurations (acting as a staging post), followed by a final symmetric termination configuration (which corresponds to the configuration in which real data will be received. Since the delay value determined for the dqs_gate signal in one configuration will typically be used as the starting point for the phase alignment in the next configuration, it may therefore be beneficial to perform such a multi-stage gate training process to enable smoothly graded transition between the first and last configurations.

Another benefit of providing multiple resistive connections which can be selected between is that this makes the differential data strobe receiver less sensitive to manufacturing process variations, since a number of resistive connections can be selected between, and appropriate usage of those resistive connections can be determined in testing.

Figure 7:
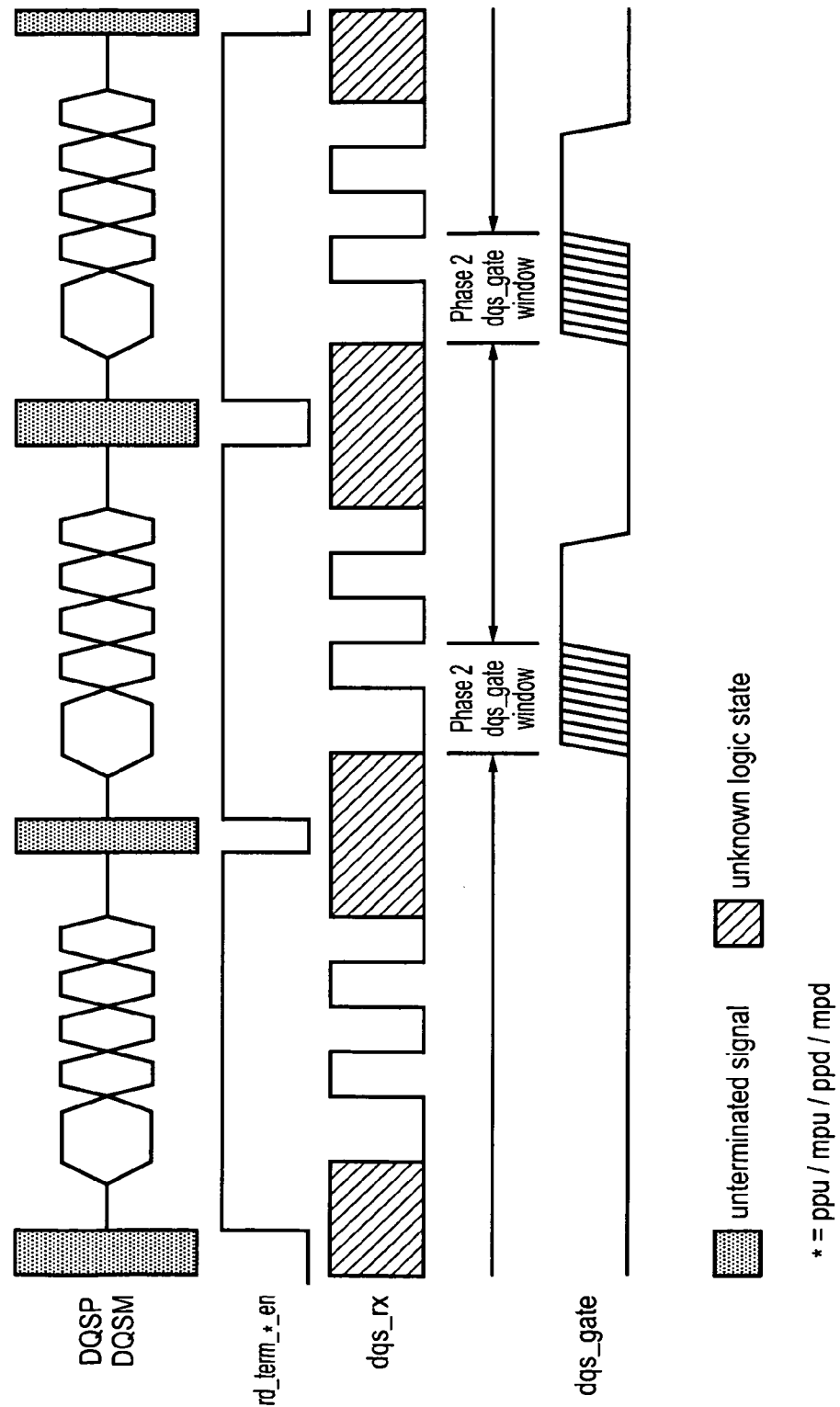
FIG. 7 schematically illustrates the timings of a subsequent training process, which follows a training process such as that illustrated in FIG. 4, in which the termination configuration is symmetric.

Once the (single or multi-stage) initial gate training process has been carried out (phase 1) with asymmetric termination, a final symmetric termination training process (phase 2) can be carried out to configure the differential data strobe receiver for real data reception. FIG. 7 illustrates the relative timing of the DQSP, DQSM, dqs_rx and dqs_gate signals. In the illustrated situation, the interface 10 has (as in FIG. 3 and FIG. 4) requested the transmission of a gate training transmission (a predetermined "training pattern") from the DRAM 20. Now, in this phase 2 training process, the symmetric termination (by simultaneous assertion of the rd_term_*_en signals) of the DQSP and DQSM transmission lines (to prepare for real data transmission) is not problematic because the preceding initial gate training process (phase 1) has enabled the DQS gate timing block 62 to establish a delay value which places the first rising edge of the dqs_gate signal within the illustrated dqs_gate window. A final iterative process of fine-tuning this delay value for this symmetric termination configuration can then be carried out.

Figure 8:
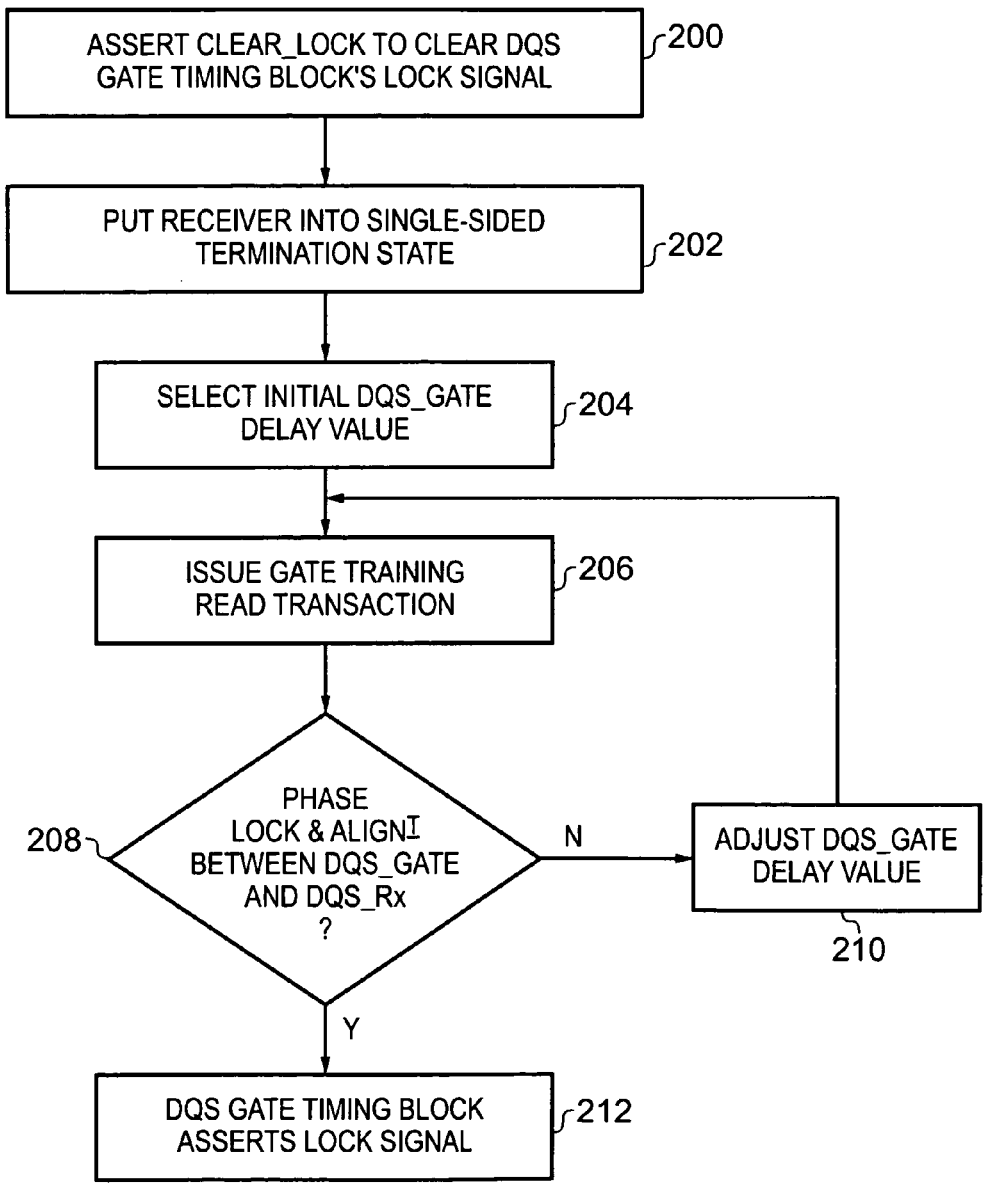
FIG. 8 schematically illustrates a series of steps taken in an initial gate training phase which uses an asymmetric termination configuration.

FIG. 8 is a flow diagram schematically illustrating a series of steps taken when the differential data strobe receiver participates in an initial gate training process with an asymmetric termination configuration (phase 1). At step 200 the CLEAR_LOCK signal is asserted to clear the DQS gate timing block's LOCK signal and to trigger the phase alignment process for dqs_gate and dqs_rx. At step 202 the differential data strobe receiver is configured with an asymmetric termination set-up. At step 204 an initial dqs_gate delay value is selected by the delay generation unit 106. Note that the order of steps 200, 202 and 204 can be freely interchanged. Then at step 206 the interface 10 issues a gate training read transaction to cause the DRAM 20 to issue a training pattern. The phase detection unit 102 monitors whether dqs_rx and dqs_gate are phase aligned, signalling this determination to control unit 100 in DQS gate timing block 62. Step 208 in the flow determines if this phase alignment is achieved. If it is not, then the flow loops back via step 210, where the dqs_gate delay value is adjusted, to step 206. Once the phase alignment is established then the DQS gate timing block 62 asserts its LOCK signal (step 212).

Figure 9:
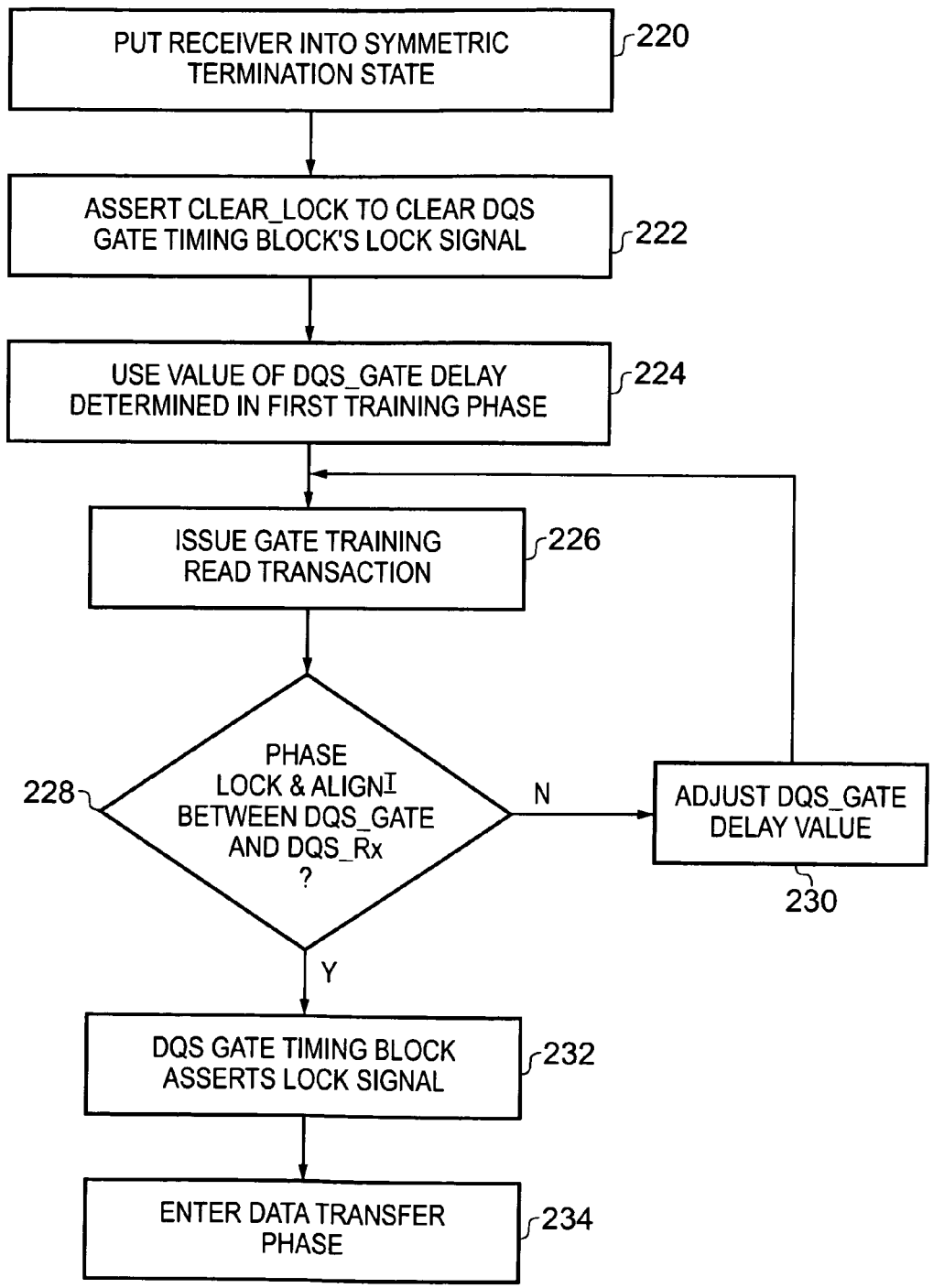
FIG. 9 schematically illustrates a series of steps taken in a subsequent gate training phase which uses a symmetric termination configuration.

FIG. 9 is a flow diagram schematically illustrating a series of steps taken when the differential data strobe receiver participates in a subsequent gate training process with an symmetric termination configuration (phase 2). At step 220 the differential data strobe receiver is configured with a symmetric termination set-up. At step 222 the CLEAR_LOCK signal is asserted to clear the DQS gate timing block's LOCK signal and to trigger the phase alignment process for dqs_gate and dqs_rx. At step 224 the dqs_gate delay value is selected by the delay generation unit 106 as that which was determined in phase 1 to provide phase alignment between dqs_rx and dqs_gate. Again, the order of steps 220, 222 and 224 can be freely interchanged. Then at step 226 the interface 10 issues a gate training read transaction to cause the DRAM 20 to issue a training pattern. The phase detection unit 102 monitors whether dqs_rx and dqs_gate are phase aligned, signalling this determination to control unit 100 in DQS gate timing block 62. Step 228 in the flow determines if this phase alignment is achieved. If it is not, then the flow loops back via step 230, where the dqs_gate delay value is adjusted, to step 226. Once the phase alignment is established then the DQS gate timing block 62 asserts its LOCK signal (step 232) and the differential data receiver is ready to enter the data transfer phase (step 234).

Figure 10:
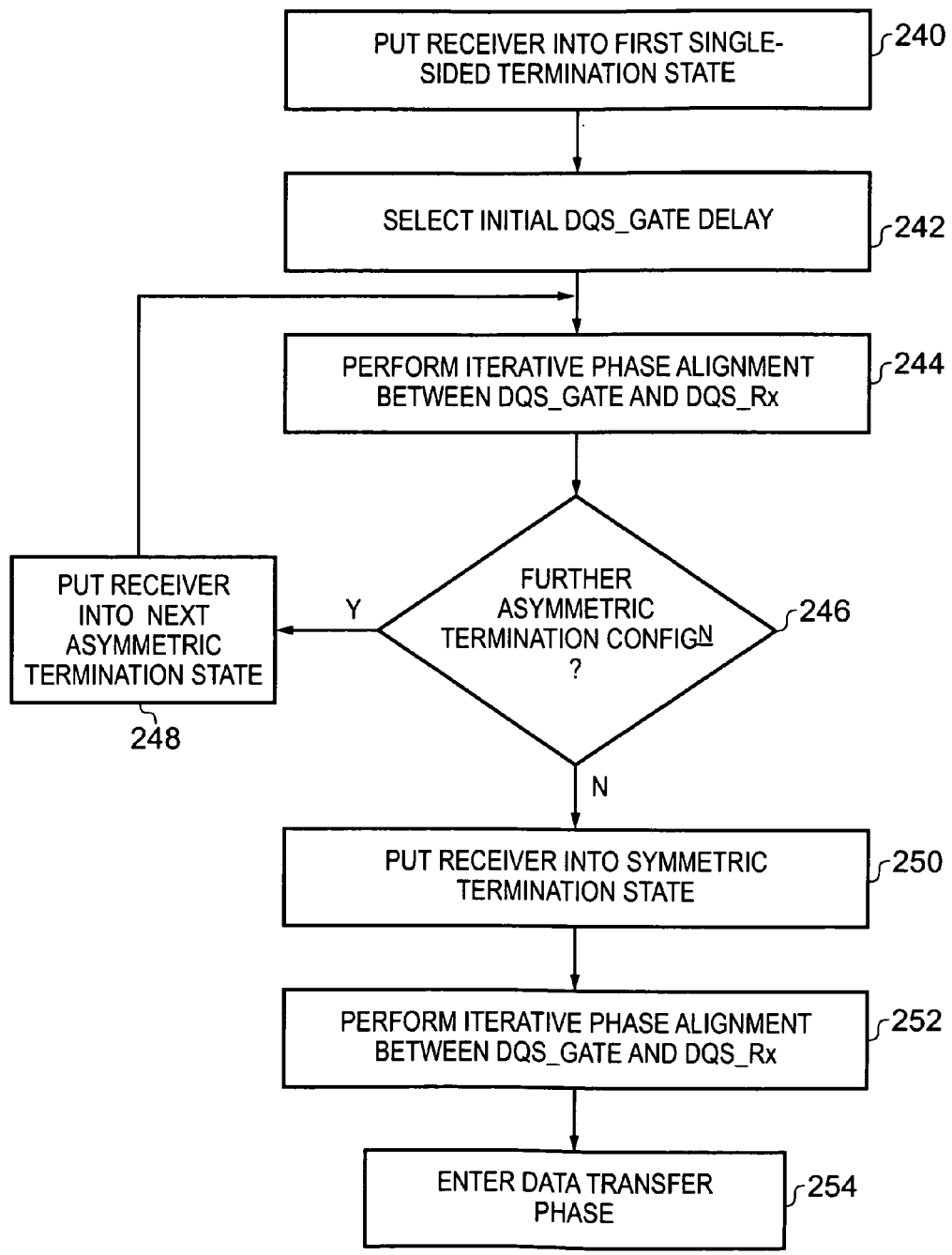
FIG. 10 schematically illustrates a series of steps taken when several asymmetric termination states are used before a final symmetric termination state.

As mentioned above, there may be more than one asymmetric termination configuration used, i.e. there may be more than one phase 1 stage to the gate training process. FIG. 10 is a flow diagram schematically illustrating a series of steps taken when the differential data strobe receiver participates in more than one asymmetric termination configuration stage (phase 1) before participating in a subsequent gate training process with an symmetric termination configuration (phase 2). At step 240 the differential data strobe receiver is placed in a strongly asymmetric termination configuration (here being a single-sided termination state). At step 242 the initial delay value for applying to dqs_gate is selected. Note that in FIG. 9 the setting and releasing of LOCK and CLEAR_LOCK is not illustrated to aid the clarity of the figure, but should be considered implicit. Step 244 represents the iterative phase alignment process between dqs_gate and dqs_rx in this asymmetric configuration (i.e. steps 206, 208 and 210 in FIG. 7). Once the phase alignment is established it is determined if a further asymmetric termination configuration should be used (step 246). If it should then the differential data strobe receiver is appropriately configured (step 248) and the flow returns to step 244. Once all asymmetric configurations have been performed (i.e. phase 1 is complete) then the flow proceeds to step 250. At step 250 the differential data strobe receiver is configured to have a symmetric termination configuration. Step 252 represents the iterative phase alignment process between dqs_gate and dqs_rx in this symmetric configuration (i.e. steps 226, 228 and 230 in FIG. 8). Once the phase alignment is established the differential data receiver is ready to enter the data transfer phase (step 254).

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A differential data strobe receiver configured to receive a differential data strobe signal at a first strobe input and a second strobe input, wherein transitions of said differential data strobe signal indicate sample points for an associated data signal, the differential data receiver configured to identify said transitions of said differential strobe signal by differentially comparing values of said differential strobe signal received at said first strobe input and said second strobe input, the differential data strobe receiver comprising:
   strobe gating circuitry configured to generate a strobe gating signal, wherein said associated data signal can only be sampled in dependence on said differential data strobe signal when said strobe gating signal is asserted; and
   strobe input termination circuitry configured selectively to provide a first termination connection for said first strobe input and a second termination connection for said second strobe input,
   wherein said differential data strobe receiver is configured, prior to receiving said differential data strobe signal in association with said associated data signal, to participate in an initial gate training process to determine a gating delay used to phase align said strobe gating signal with respect to said differential data strobe signal,
   wherein said strobe input termination circuitry is configured to provide an asymmetric configuration of said first termination connection and said second termination connection during said initial gate training process.

2. The differential data strobe receiver as claimed in claim 1, comprising a first voltage source and a second voltage source, wherein said first voltage source and said second voltage source define a maximum voltage range of said differential data strobe signal.

3. The differential data strobe receiver as claimed in claim 2, wherein said strobe input termination circuitry is configured to provide said asymmetric configuration by exclusively coupling said first strobe input to said first voltage source and by exclusively coupling said second strobe input to said second voltage source.

4. The differential data strobe receiver as claimed in claim 2, wherein said strobe input termination circuitry is configured to provide said asymmetric configuration by coupling said first strobe input and said second strobe input to said first voltage source via first resistors of differing resistance and by coupling said first strobe input and said second strobe input to said second voltage source via second resistors of differing resistance.

5. The differential data strobe receiver as claimed in claim 2, wherein said strobe input termination circuitry comprises plural first resistors via which said first strobe input is connectable to said first voltage source and plural second resistors via which said second strobe input is connectable to said second voltage source.

6. The differential data strobe receiver as claimed in claim 5, wherein said strobe input termination circuitry is configured to select a connection between said first strobe input and said first voltage source from said plural first resistors.

7. The differential data strobe receiver as claimed in claim 2, wherein said strobe input termination circuitry comprises more than one first resistor via which said first strobe input is connectable to said second voltage source and more than one second resistor via which said second strobe input is connectable to said first voltage source.

8. The differential data strobe receiver as claimed in claim 7, wherein said strobe input termination circuitry is configured to select a connection between said second strobe input and said second voltage source from said plural second resistors.

9. The differential data strobe receiver as claimed in claim 2, wherein said strobe input termination circuitry is responsive to plural termination enable signals to selectively couple said first strobe input and said second strobe input to said first voltage source and said second voltage source.

10. The differential data strobe receiver as claimed in claim 1, wherein said differential data strobe receiver is configured, prior to receiving said differential data strobe signal in association with said associated data signal and after said initial gate training process, to participate in a further gate training process to determine an adjusted version of said gating delay for use when receiving said differential data strobe signal in association with said associated data signal,
   wherein said strobe input termination circuitry is configured to provide a symmetric configuration of said first termination connection and said second termination connection during said further gate training process.

11. The differential data strobe receiver as claimed in claim 10, wherein said strobe input termination circuitry is configured to provide said symmetric configuration corresponding to a data transfer configuration of said first termination connection and said second termination connection used for receiving said differential data strobe signal in association with said associated data signal.

12. The differential data strobe receiver as claimed in claim 10, wherein said differential data strobe receiver is configured to use said gating delay as a starting value for said adjusted version of said gating delay when beginning said further gate training process.

13. The differential data strobe receiver as claimed in claim 1, wherein said differential data strobe receiver is configured to participate in a multi-stage initial gate training process, wherein said strobe input termination circuitry is configured to provide a different asymmetric configuration of said first termination connection and said second termination connection for each stage of said multi-stage initial gate training process.

14. The differential data strobe receiver as claimed in claim 1, further comprising phase detection circuitry configured to determine a phase alignment of said strobe gating signal with respect to said differential data strobe signal in dependence on said gating delay.

15. The differential data strobe receiver as claimed in claim 14, configured to cause a gate training transaction request to be intermittently sent to a source of said differential data strobe signal and said associated data signal until said phase detection circuitry indicates said phase alignment has been achieved, wherein said gate training transaction request causes a predetermined training pattern to be applied to said differential data strobe signal.

16. The differential data strobe receiver as claimed in claim 15, wherein said phase detection circuitry is configured to determine said phase alignment of said strobe gating signal with respect to a first valid transition of said predetermined training pattern.

17. The differential data strobe receiver as claimed in claim 1, configured to apply a signal delay to said differential data strobe signal after said strobe gating signal has been phase aligned with respect to said differential data strobe signal.

18. Memory access circuitry comprising the differential data strobe receiver as claimed in claim 1.

19. Memory access circuitry as claimed in claim 18, wherein said differential data strobe signal is a read data strobe signal.

20. Memory access circuitry as claimed in claim 18, wherein said differential data strobe signal is a write data strobe signal.

21. Memory access circuitry as claimed in claim 18, configured to access DRAM memory.

22. A differential data strobe receiver configured to receive a differential data strobe signal at a first strobe input and a second strobe input, wherein transitions of said differential data strobe signal indicate sample points for an associated data signal, the differential data receiver comprising differential comparison means for identifying said transitions of said differential strobe signal by differentially comparing values of said differential strobe signal received at said first strobe input and said second strobe input, the differential data strobe receiver comprising:

strobe gating means for generating a strobe gating signal, wherein said associated data signal can only be sampled in dependence on said differential data strobe signal when said strobe gating signal is asserted; and strobe input termination means for selectively providing a first termination connection for said first strobe input and a second termination connection for said second strobe input, wherein said differential data strobe receiver is configured, prior to receiving said differential data strobe signal in association with said associated data signal, to participate in an initial gate training process to determine a gating delay used to phase align said strobe gating signal with respect to said differential data strobe signal, wherein said strobe input termination means is configured to provide an asymmetric configuration of said first termination connection and said second termination connection during said initial gate training process.

23. A method of operating a differential data strobe receiver configured to receive a differential data strobe signal at a first strobe input and a second strobe input, wherein transitions of said differential data strobe signal indicate sample points for an associated data signal, the differential data receiver configured to identify said transitions of said differential strobe signal by differentially comparing values of said differential strobe signal received at said first strobe input and said second strobe input, the method comprising the steps of:

generating a strobe gating signal, wherein said associated data signal can only be sampled in dependence on said differential data strobe signal when said strobe gating signal is asserted;

selectively providing a first termination connection for said first strobe input and a second termination connection for said second strobe input;

prior to receiving said differential data strobe signal in association with said associated data signal, participating in an initial gate training process to determine a gating delay used to phase align said strobe gating signal with respect to said differential data strobe signal; and providing an asymmetric configuration of said first termination connection and said second termination connection during said initial gate training process.

* * * * *